United States Patent
Cox et al.

(10) Patent No.: US 6,353,370 B1
(45) Date of Patent: Mar. 5, 2002

(54) METHOD AND APPARATUS FOR MODULATION OF A VOLTAGE CONTROLLED OSCILLATOR

(75) Inventors: Robert Cox, Little Abington; Gwilyn Luff, Great Shelford, both of (GB)

(73) Assignee: Micro Linear Corporation, San Jose, CA (US)

( * ) Notice: Subject to any disclaimer, the term of this patent is extended or adjusted under 35 U.S.C. 154(b) by 0 days.

(21) Appl. No.: 09/684,475

(22) Filed: Oct. 4, 2000

(51) Int. Cl.[7] .............................. H03B 5/12; H03C 3/00; H03C 3/08; H03C 3/22
(52) U.S. Cl. ............... 331/117 R; 331/175; 331/177 V; 332/124; 332/136; 332/141
(58) Field of Search ................ 331/8, 10, 17, 331/23, 36 C, 108 R, 116 R, 116 FE, 117 R, 117 FE, 117 D, 175, 177 V; 332/123, 124, 136, 138–143

(56) References Cited

U.S. PATENT DOCUMENTS 5,097,228 A * 3/1992 McJunkin .................... 331/176
5,714,915 A * 2/1998 Brilka ..................... 331/117 R

* cited by examiner

*Primary Examiner*—David Mis
(74) *Attorney, Agent, or Firm*—Haverstock & Owens LLP

(57) ABSTRACT

A method and apparatus for modulation of a voltage-controlled oscillator (VCO). The VCO receives a tuning control voltage for adjusting a center frequency of an output periodic signal formed by the VCO. In addition, the VCO receives a modulation control voltage for modulating the output periodic signal by a content-carrying signal according to frequency modulation techniques. A frequency deviation obtained in the output periodic signal in response to changes in the modulation control voltage is linearized by forming the modulation control voltage as the result of a linear correction polynomial. A linear correction circuit forms the modulation control voltage. More particularly, a first amplifier having a gain of $K_1$ receives the tuning control voltage. A first summing block then receives the output of the first amplifier and adds the constant $K_0$. A second amplifier having a gain of m receives the content-carrying signal. An output of the second amplifier and an output of the first summing block are summed by a second summing block. An output of the second summing block forms the modulation control voltage. The present invention results in a more linear relationship between changes in a modulation control voltage applied to the VCO and frequency deviation in the VCO output signal in comparison to prior techniques.

24 Claims, 5 Drawing Sheets

US 6,353,370 B1

METHOD AND APPARATUS FOR MODULATION OF A VOLTAGE CONTROLLED OSCILLATOR

FIELD OF THE INVENTION

The present invention relates to the field of voltage-controlled oscillators (VCOs). More particularly, the present invention relates to the field of modulation of the operating frequency of a voltage controlled oscillator.

BACKGROUND OF THE INVENTION

A voltage-controlled oscillator (VCO) forms a periodic output signal where a frequency of the periodic output signal is related to the level of an input control voltage. The center frequency of a VCO is defined as the frequency of the periodic output signal formed by the VCO when the input control voltage is set to a nominal level, such as zero volts. The input control voltage is then adjusted up or down to control the frequency of the periodic output signal.

VCOs are used in variety of applications, such as for transmitting information according to frequency modulation techniques. To implement frequency modulation using a VCO, the center frequency is set equal to a carrier frequency to be utilized for transmitting the information. The input control voltage is then adjusted up or down in response to an information-carrying signal, thus, forming a frequency modulated signal. The frequency modulated signal is transmitted via a transmission medium to a receiver tuned to the carrier frequency. The information-carrying signal is then recovered by demodulating the received signal.

FIG. 1 illustrates a schematic diagram of a conventional VCO including a cross-coupled transistor pair. A first terminal of an inductor $L_1$ and a first terminal of an inductor $L_2$ are coupled to a supply voltage node $V_{CC}$. A second terminal of the inductor $L_1$ forms a node $N_1$ and is coupled to a collector of a transistor $Q_1$, to a base of a transistor $Q_2$, to a cathode of a varactor diode $D_1$, and to a cathode of a varactor diode $D_2$. A second terminal of the inductor $L_2$ forms a node $N_2$ and is coupled to a collector of the transistor $Q_2$, to a base of the transistor $Q_1$, to a cathode of a varactor diode $D_3$, and to a cathode of a varactor diode $D_4$.

An anode of the varactor $D_1$ and an anode of the varactor $D_3$ are coupled to a first terminal of a resistor $R_1$. A second terminal of the resistor $R_1$ is coupled to receive a tuning control voltage $V_{tune1}$. An anode of the varactor $D_2$ and an anode of the varactor $D_4$ are coupled to a first terminal of a resistor $R_2$. A second terminal of the resistor $R_2$ is coupled to receive a modulation control voltage $V_{mod1}$. An emitter of the transistor $Q_1$ and an emitter of the transistor $Q_2$ are coupled to a first terminal of a resistor $R_3$. A second terminal of the resistor $R_3$ is coupled to the ground node.

In operation, an output voltage signal $V_{out1}$ formed across the nodes $N_1$ and $N_2$ is generally a sinusoid which oscillates at the resonant frequency of the VCO. When the node $N_1$ is at a higher voltage level than the level of the node $N_2$, the transistor $Q_2$ has a higher bias voltage than the transistor $Q_1$. Accordingly, nearly all of the current through the resistor $R_3$ passes through the right side of the VCO (through the inductor $L_2$ and the transistor $Q_2$). This tends to reinforce the voltage at the node $N_1$ being higher than the voltage at the node $N_2$. Accordingly, this results in positive feedback in the VCO.

Eventually, however, because there is little or no current passing through the inductor $L_1$ and the transistor $Q_1$, the voltage at the node $N_2$ tends to rise relative to the level at the node $N_1$. In response, the bias on the transistor $Q_1$ increases while the bias on the transistor $Q_2$ decreases. This reduces the current in the right side of the VCO and increases the current in the left side (through the inductor $L_1$ and the transistor $Q_1$). Eventually, nearly all of the current through the resistor $R_3$ passes through the left side which reinforces the voltage at the node $N_2$ being higher than the voltage at the node $N_1$, through positive feedback.

Because there is little or no current passing through the right side of the VCO, the voltage at the node $N_1$ tends to rise relative to the level at the node $N_2$. In response, the bias on the transistor $Q_2$ increases while the bias on the transistor $Q_1$ decreases. Accordingly, the above-described cycle repeats. In this manner, current is alternately steered through the right and left sides of the VCO, thereby forming a the output sinusoidal signal $V_{out1}$ across the nodes $N_1$ and $N_2$.

The tuning control voltage $V_{tune1}$ is typically adjusted such that the output periodic signal $V_{out1}$ oscillates at the desired center frequency when the modulation control voltage $V_{mod1}$ is at a nominal level. The modulation control voltage $V_{mod1}$ is then adjusted up or down to control the frequency of the output periodic signal $V_{out1}$. A drawback to the conventional VCO illustrated in FIG. 1 is that the frequency deviation obtained in the output signal $V_{out1}$ depends upon capacitance of each of the varactors $D_1$–$D_4$ and the amplitude of the modulation control voltage $V_{mod1}$. As the capacitance of the varactors $D_1$ and $D_3$ increases in response to adjusting the tuning control voltage $V_{tune1}$, the frequency deviation obtained at the output signal $V_{out1}$ for a given modulation control voltage $V_{mod1}$ level is reduced. Conversely, as the capacitance of the varactors $D_1$ and $D_3$ is reduced in response to adjusting the tuning control voltage $V_{tune1}$, the frequency deviation obtained at the output $V_{out1}$ for a given modulation control voltage $V_{mod1}$ level increases. As a result, the VCO exhibits undesired, non-linear behavior.

FIG. 2 illustrates an exemplary graph of tuning control voltage $V_{tune1}$ vs. frequency deviation in the output $V_{out1}$ in response to changes in the modulation control voltage $V_{mod1}$ for the VCO illustrated in FIG. 1. Thus, when the tuning control voltage $V_{tune1}$ is at a level given on the x-axis, and the frequency deviation which results from an incremental (e.g., one millivolt) change in the modulation control voltage $V_{mod1}$ is given on the y-axis. As can be seen from FIG. 2, the frequency deviation changes in a non-linear fashion with changes in the tuning control voltage $V_{tune1}$. Difficulties can be encountered when attempting to demodulate a signal which has been modulated by a VCO which exhibits such a non-linear characteristic.

Therefore, what is needed is a technique for obtaining a more linear relationship between a tuning control voltage and frequency deviation in a VCO output signal resulting from changes in a modulation control voltage applied to the VCO.

SUMMARY OF THE INVENTION

The invention is a method and apparatus for modulation of a voltage-controlled oscillator (VCO). The VCO receives a tuning control voltage for adjusting a center frequency of an output periodic signal formed by the VCO. In addition, the VCO receives a modulation control voltage for modulating the output periodic signal by a content-carrying signal according to frequency modulation techniques. A frequency deviation obtained in the output periodic signal in response to changes in the modulation control voltage is linearized by forming the modulation control voltage as the result of a linear correction polynomial. The linear correction polynomial is preferably of the form:

$$V_{mod2} = K_0 + (K_1)(V_{tune2}) + m(V_{sig})$$

where $V_{mod2}$ is the modulation control voltage, $V_{tune2}$ is the tuning control voltage, $V_{sig}$ is the content carrying signal and $K_0$, $K_1$ and m are constants. Appropriate values for the constants $K_0$, and $K_1$ can be determined by measuring the voltage level for $V_{mod2}$ required to obtain a desired frequency deviation at various values of the tuning control voltage $V_{tune2}$ (e.g., two endpoints and a center value) and with an assumed value of $m(V_{sig})$. Such measurements produce a numerical function which can be approximated with an interpolating polynomial by selecting the values for $K_0$ and $K_1$. The value of m can be selected to achieve a desired proportionality between frequency deviation and amplitude of the content-carrying signal $V_{sig}$.

A linear correction circuit forms the modulation control voltage. More particularly, a first amplifier having a gain of $K_1$ receives the tuning control voltage ($V_{tune2}$). A first summing block then receives the output of the first amplifier and adds the constant $K_0$. A second amplifier having a gain of m receives the content-carrying signal ($V_{sig}$). An output of the second amplifier and an output of the first summing block are summed by a second summing block. An output of the second summing block forms the modulation control voltage ($V_{mod2}$).

The present invention results in a more linear relationship, in comparison to prior techniques, between a tuning control voltage and frequency deviation in a VCO output signal resulting from changes in a modulation control voltage applied to the VCO.

DETAILED DESCRIPTION OF A PREFERRED EMBODIMENT

Figure 1:
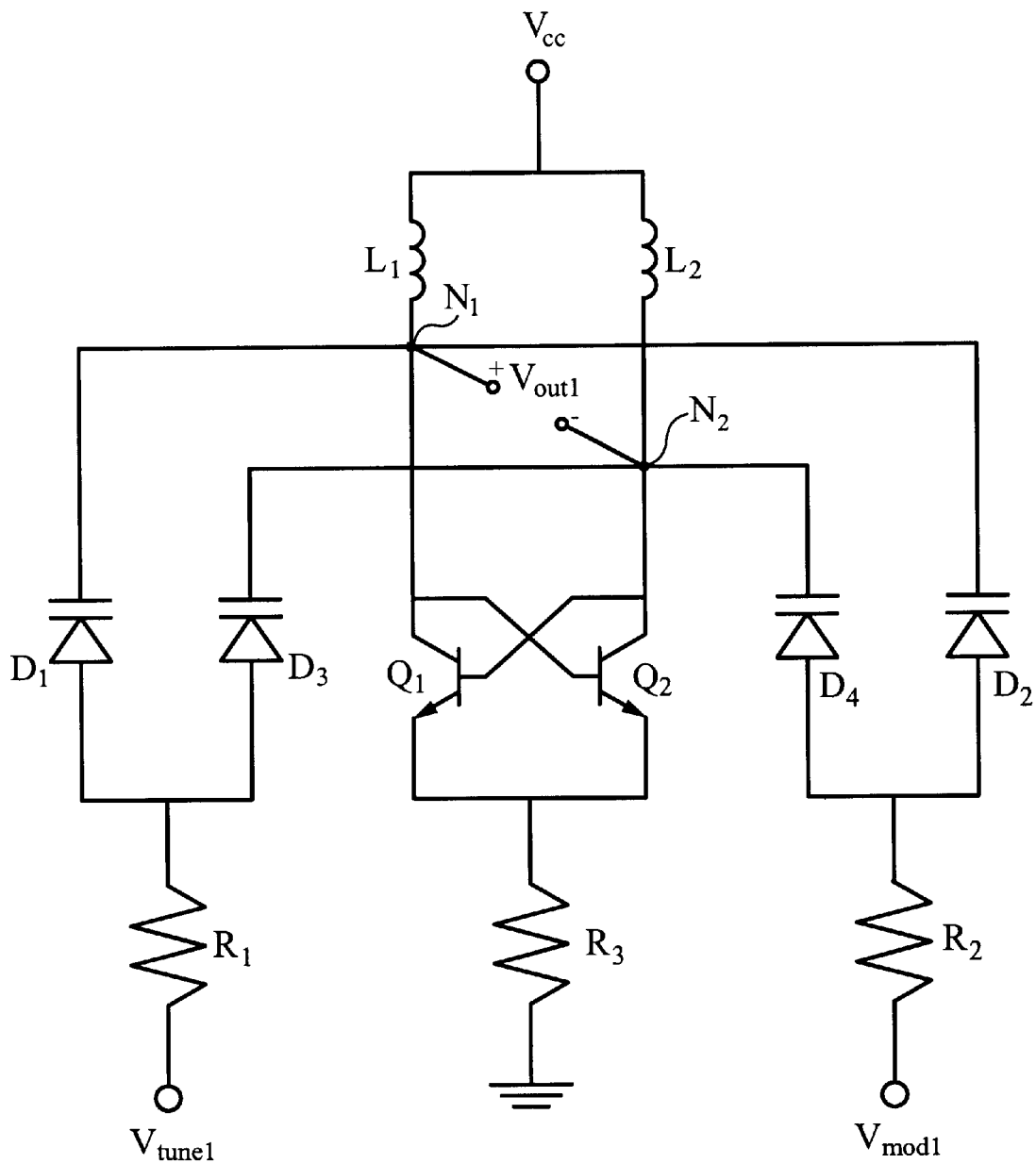
FIG. 1 illustrates a schematic diagram of a conventional VCO including a cross-coupled transistor pair.
Figure 2:
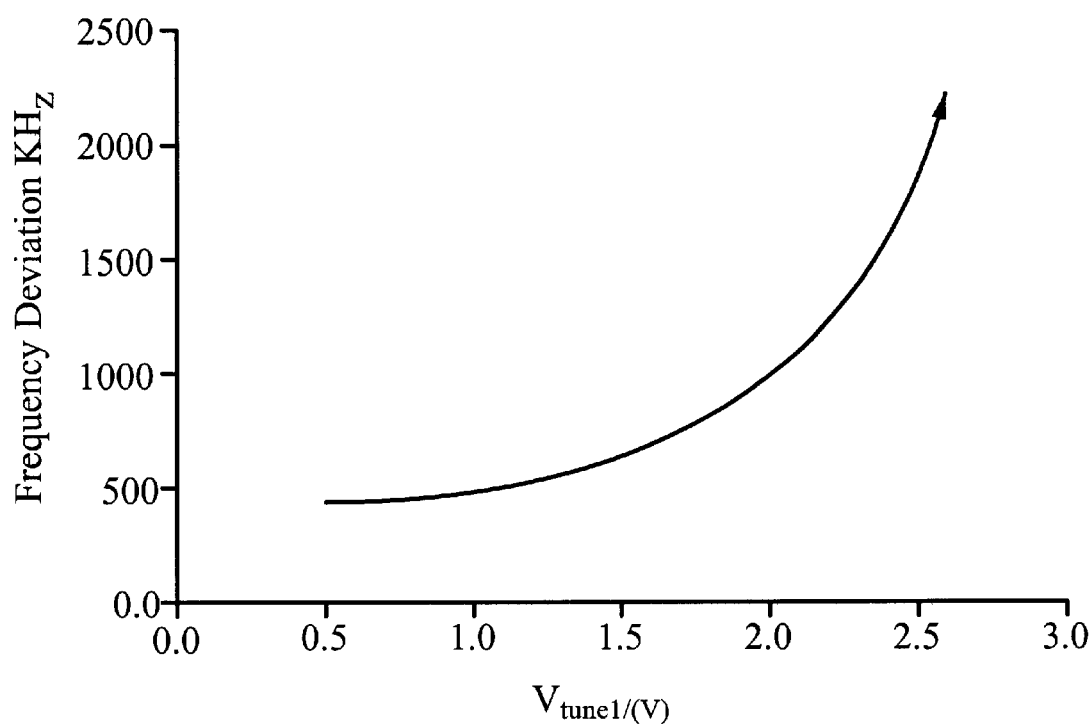
FIG. 2 illustrates an exemplary graph of tuning control voltage $V_{tune1}$ vs. frequency deviation in the output $V_{out1}$ in response to changes in the modulation control voltage $V_{mod1}$ for the VCO illustrated in FIG. 1.
Figure 3:
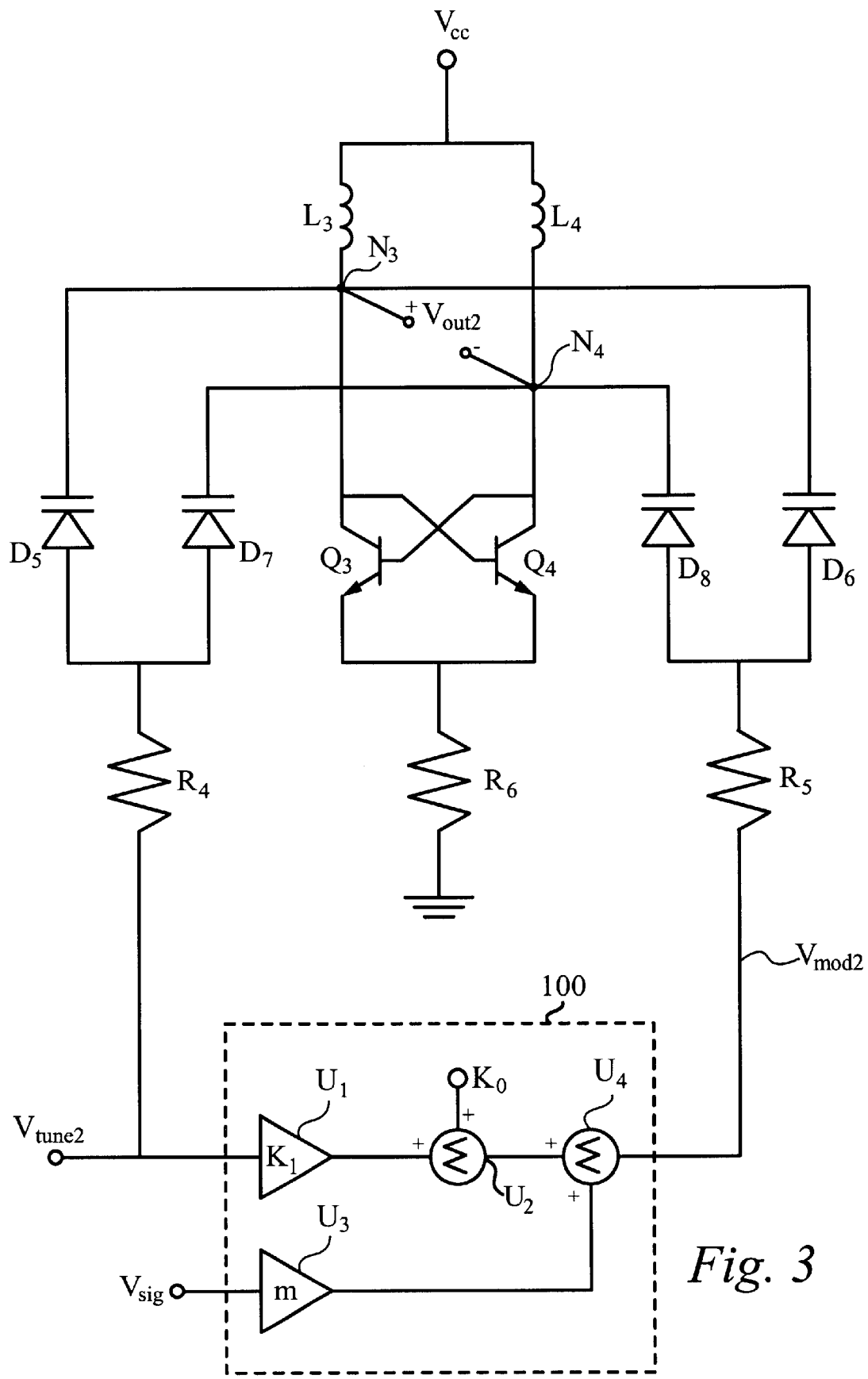
FIG. 3 illustrates a schematic diagram of a VCO including a linear correction circuit in accordance with the present invention.

FIG. 3 illustrates a schematic diagram of a VCO including a linear correction circuit in accordance with the present invention. A first terminal of an inductor $L_3$ and a first terminal of an inductor $L_4$ are coupled to a supply voltage node $V_{CC}$. A second terminal of the inductor $L_3$ forms a node $N_3$ and is coupled to a collector of a transistor $Q_3$, to a base (control terminal) of a transistor $Q_4$, to a cathode of a varactor diode $D_5$, and to a cathode of a varactor diode $D_6$. A second terminal of the inductor $L_4$ forms a node $N_4$ and is coupled to a collector of the transistor $Q_4$, to a base (control terminal) of the transistor $Q_3$, to a cathode of a varactor diode $D_7$, and to a cathode of a varactor diode $D_8$.

An anode of the varactor $D_5$ and an anode of the varactor $D_7$ are coupled to a first terminal of a resistor $R_4$. A second terminal of the resistor $R_4$ is coupled to receive a tuning control voltage $V_{tune2}$. An anode of the varactor $D_6$ and an anode of the varactor $D_8$ are coupled to a first terminal of a resistor $R_5$. A second terminal of the resistor $R_5$ is coupled to receive a modulation control voltage $V_{mod2}$. An emitter (output terminal) of the transistor $Q_3$ and an emitter (output terminal) of the transistor $Q_4$ are coupled to a first terminal of a resistor $R_6$. A second terminal of the resistor $R_6$ is coupled to the ground node.

In operation, an output voltage signal $V_{out2}$ formed across the nodes $N_3$ and $N_4$ is generally a sinusoid which oscillates at the resonant frequency of the VCO. When the node $N_3$ is at a higher voltage level than the level of the node $N_4$, the transistor $Q_4$ has a higher bias voltage than the transistor $Q_3$. Accordingly, nearly all of the current through the resistor $R_6$ passes through the right side of the VCO (through the inductor $L_4$ and the transistor $Q_4$). This tends to reinforce the voltage at the node $N_3$ being higher than the voltage at the node $N_4$. Accordingly, this results in positive feedback in the VCO.

Eventually, however, because there is little or no current passing through the inductor $L_3$ and the transistor $Q_3$, the voltage at the node $N_4$ tends to rise relative to the level at the node $N_3$. In response, the bias on the transistor $Q_3$ increases while the bias on the transistor $Q_4$ decreases. This reduces the current in the right side of the VCO and increases the current in the left side (through the inductor $L_3$ and the transistor $Q_3$). Eventually, nearly all of the current through the resistor $R_6$ passes through the left side which reinforces the voltage at the node $N_4$ being higher than the voltage at the node $N_3$, through positive feedback.

Because these is little or no current passing through the right side of the VCO, the voltage at the node $N_3$ tends to rise relative to the level at the node $N_4$. In response, the bias on the transistor $Q_4$ increases while the bias on the transistor $Q_3$ decreases. Accordingly, the above-described cycle repeats. In this manner, current is alternately steered through the right and left sides of the VCO, thereby forming a the output sinusoidal signal $V_{out2}$ across the nodes $N_3$ and $N_4$.

Together, the inductors $L_3$ and $L_4$, and the varactors $D_5$–$D_8$, form an L-C portion of the VCO. Variable capacitance for the L-C portion is provided by the varactors $D_5$–$D_7$, however, it will be apparent that one or more discrete capacitors (e.g., coupled in series or in parrallel with the inductors $L_3$ or $L_4$) can also be utilized to provide a fixed capacitance for the L-C portion of the VCO. An output periodic signal $V_{out2}$ is obtained across the nodes $N_3$ and $N_4$. The frequency of the output signal $V_{out2}$ is dependent upon the capacitance of the L-C portion of the VCO.

A linear correction circuit 100 forms the modulation control voltage $V_{mod2}$ from a content-carrying signal $V_{sig}$ and the tuning control voltage $V_{tune2}$. More particularly, an amplifier $U_1$ having a gain of $K_1$ receives the tuning control voltage ($V_{tune2}$). A first summing block $U_2$ then receives the output of the amplifier $U_1$ and adds the constant $K_0$. An amplifier $U_3$ having a gain of m receives the content-carrying signal ($V_{sig}$). An output of the amplifier $U_3$ and an output of the first summing block $U_2$ are summed by a second summing block $U_4$. An output of the second summing block $U_4$ forms the modulation control voltage ($V_{mod2}$). Though the elements $U_1$–$U_4$ of the correction circuit 100 are illustrated as discrete elements, it will be apparent that the elements $U_1$–$U_4$ can be integrated and their functions combined. In addition, it will be apparent that the summing blocks $U_2$ and $U_4$ can be implemented simply as nodes.

A frequency deviation obtained in the output periodic signal $V_{out2}$ in response to changes in the modulation control voltage $V_{mod2}$ is linearized by the correction circuit 100 forming the modulation control voltage $V_{mod2}$ as the result of a linear correction polynomial. The linear correction polynomial is preferably of the form:

$$V_{mod2}=K_0+(K_1)(V_{tune2})+m(V_{sig})$$

where $V_{mod2}$ is the modulation control voltage, $V_{tune2}$ is the tuning control voltage, $V_{sig}$ is the content carrying signal and $K_0$, $K_1$ and m are constants. Appropriate values for the constants $K_0$, and $K_1$ can be determined by measuring the voltage level for $V_{mod2}$ required to obtain a desired frequency deviation at various values of the tuning control voltage $V_{tune2}$ (e.g., two endpoints and a center value) and with an assumed value of $m(V_{sig})$. Such measurements produce a numerical function which can be approximated with an interpolating polynomial by selecting the values for $K_0$ and $K_1$. The value of m can be selected to achieve a desired proportionality between frequency deviation and amplitude of $V_{sig}$.

As a result of the correction polynomial implemented by the correction circuit 100, a more linear relationship is obtained between the tuning control voltage $V_{tune2}$ and frequency deviation in a VCO output signal resulting from changes in a modulation control voltage $V_{mod2}$ applied to the VCO.

In the preferred embodiment, the correction polynomial is first order of $V_{tune2}$ as described above. Simulations of the invention suggest that a first order correction polynomial will correct a deviation variation measured at −20%, +25% without correction to −2.8%, +2.4% with correction over a 5:1 variation in $V_{tune2}$ at a fixed temperature. It will be apparent, however, that the correction polynomial implemented by the correction circuit 100 can be an arbitrary order of $V_{tune2}$. As the order of the correction polynomial increases, the linearity of the frequency deviation response also tends to increase. Higher order correction polynomials, however, will tend to improve the linearity only to a certain extent because temperature and process variations will eventually dominate the results.

Figure 4:
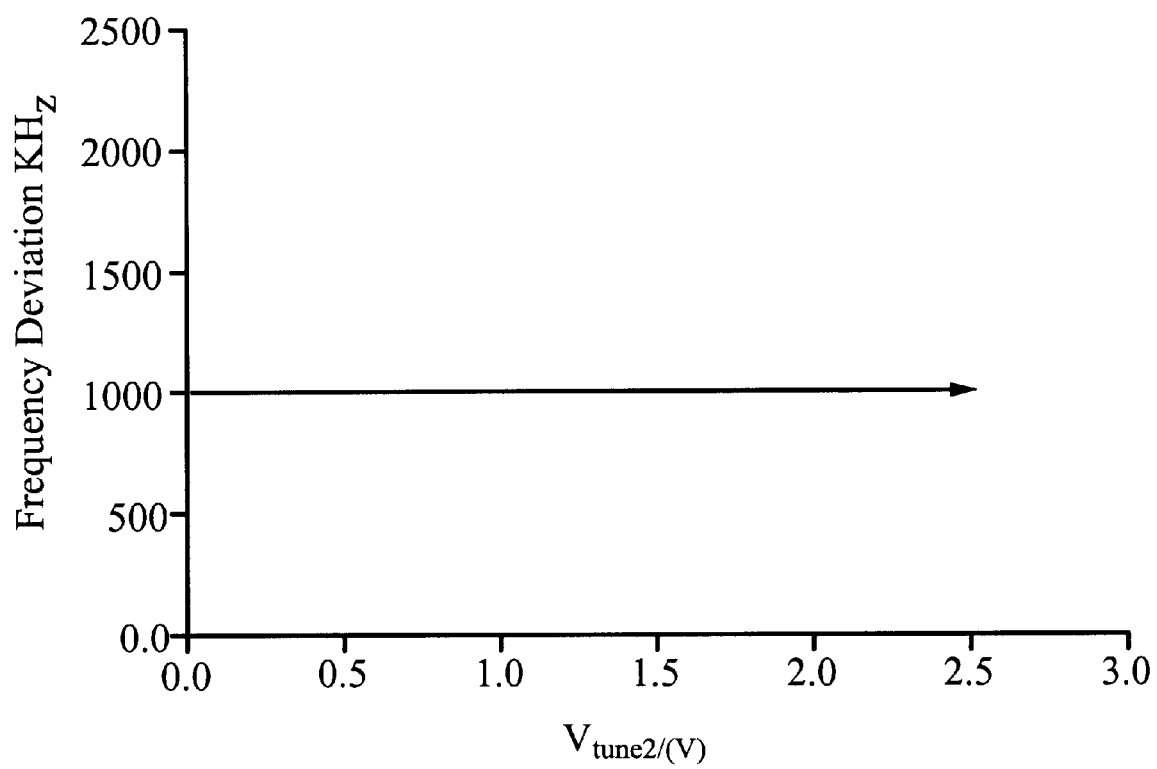
FIG. 4 illustrates an exemplary graph of tuning control voltage $V_{tune2}$ vs. frequency deviation in the output $V_{out2}$ in response to changes in the modulation control voltage $V_{mod2}$ for the VCO illustrated in FIG. 3.

FIG. 4 illustrates an exemplary graph of offset voltage $V_{offset2}$ vs. frequency deviation in the output $V_{out2}$ for the VCO illustrated in FIG. 3. Thus, when the tuning control voltage $V_{tune2}$ is at a level given on the x-axis, and the frequency deviation which results from an incremental (e.g., one millivolt) change in the modulation control voltage $V_{mod2}$ is given on the y-axis. As can be seen from FIG. 4, the frequency deviation is substantially constant despite changes in the tuning control voltage $V_{tune2}$. This improves results obtained when demodulating a signal which has been modulated by a VCO which exhibits such a linear characteristic.

Figure 5:
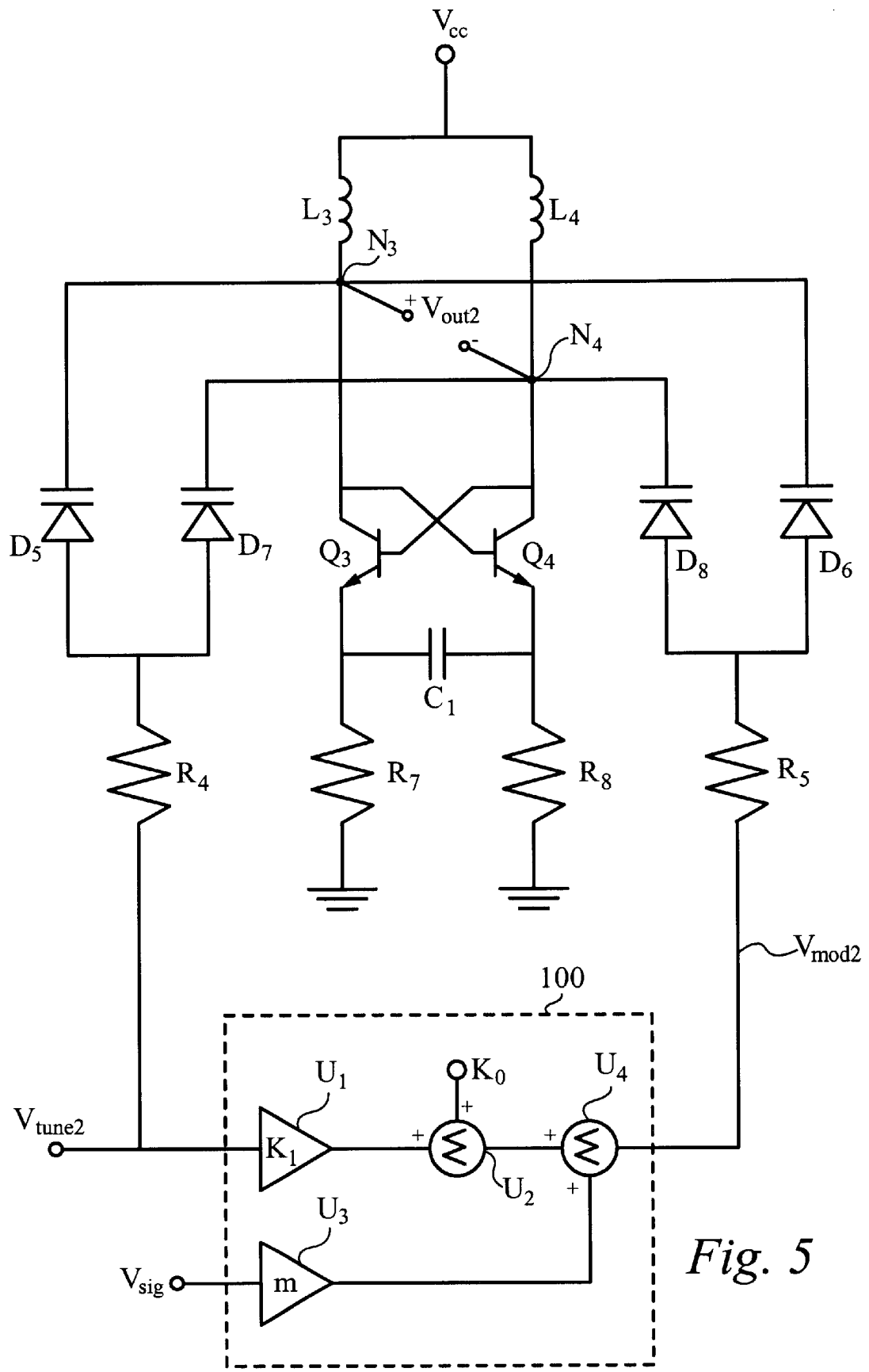
FIG. 5 illustrates a schematic diagram of a VCO including a linear correction circuit in accordance with an alternate embodiment of the present invention.

FIG. 5 illustrates a schematic diagram of a VCO including a linear correction circuit in accordance with an alternate embodiment of the present invention. The VCO illustrated in FIG. 5 differs from that illustrated in FIG. 3 in that the resistor $R_6$ of FIG. 3 omitted and the emitters of the transistors $Q_3$ and $Q_4$ are no longer coupled together. Instead, in FIG. 5, a capacitor $C_1$ is coupled across the emitters of the transistors $Q_3$ and $Q_4$, a first terminal of a resistor $R_7$ is coupled to the emitter of $Q_3$ and a first terminal of a resistor $R_8$ is coupled to the emitter of $Q_4$. A second terminal of the resistor $R_7$ and a second terminal of the resistor $R_8$ are coupled to the ground node.

The capacitor $C_1$ coupled across the emitters of the cross-coupled pair of transistors $Q_3$ and $Q_4$ in FIG. 5 counteracts the effects of phase lag caused by the transistors $Q_3$ and $Q_4$. Accordingly, this arrangement provides improved performance in that it results in a higher small-signal loop gain at the zero phase crossing which provides reliable start-up; has a peak gain which is closer to a zero phase crossing, which reduces frequency drift during settling; and has a low output susceptance. Also, a periodic output signal formed by the VCO can be taken at the emitters of the cross-coupled pair $Q_3$ and $Q_4$ (across the capacitor $C_1$), which avoids having to utilize a buffer which could increase phase noise.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components, current levels, and voltage levels disclosed herein. Further, it would be within the scope of the invention to substitute another type of transistor, such as a field effect transistor, for any of the transistors disclosed herein. In addition, though the preferred VCO includes a cross-coupled pair of transistors, it will be apparent that the VCO be of another topology.

What is claimed is:

1. An apparatus for linearizing a frequency deviation response for a voltage controlled oscillator, the apparatus comprising:

a. a voltage-controlled oscillator having a tuning input to receive a tuning control signal to adjust a center frequency for the voltage-controlled oscillator and a modulation input to receive a modulation control signal to modulate an output signal formed by the voltage-controlled oscillator; and b. a correction circuit coupled to the voltage-controlled oscillator to receive the tuning control signal and a content-carrying signal to form the modulating control signal based upon the tuning control signal and the content-carrying signal.

2. The apparatus according to claim 1 wherein the correction circuit forms a first order polynomial.

3. The apparatus according to claim 1 wherein the correction circuit forms a polynomial of the form:

$$V_{mod2}=K_0+(K_1)(V_{tune2})+m(V_{sig})$$

where $V_{mod2}$ is the modulation control voltage, $V_{tune2}$ is the tuning control voltage, $V_{sig}$ is the content carrying signal and $K_0$, $K_1$ and m are constants.

4. The apparatus according to claim 1 wherein the correction circuit comprises:

a. a first amplifier having a constant gain coupled to receive the tuning control voltage for forming a first amplifier output;

b. a first summing block coupled to receive the first amplifier output and a constant for forming a first summing block output;

c. a second amplifier having a constant gain coupled to receive the content-carrying signal for forming a second amplifier output; and d. a second summing block coupled to receive the first summing block output and the second amplifier output for forming the modulation control signal.

5. The apparatus according to claim 1 wherein the voltage-controlled oscillator comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a resistor having a first terminal coupled to output terminals of the cross-coupled pair of transistors and a second terminal coupled to a ground node.

6. The apparatus according to claim 1 wherein the voltage-controlled oscillator comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a capacitor coupled across output terminals of the cross-coupled pair of transistors; and
   d. a pair of resistors each having a first terminal coupled to a respective one the output terminals of the cross-coupled pair of transistors and each having a second terminal coupled to a ground node.

7. An apparatus for linearizing a frequency deviation response for a voltage controlled oscillator, the apparatus comprising:
   a. oscillator means having a tuning input for receiving a tuning control signal for adjusting a center frequency for the oscillator means and a modulation input for receiving a modulation control signal for modulating an output signal formed by the oscillator means; and
   b. means for forming the modulating control signal based upon the tuning control signal and a content-carrying signal wherein the means for forming is coupled to the oscillator means.

8. The apparatus according to claim 7 wherein the means for forming forms a first order polynomial.

9. The apparatus according to claim 7 wherein the means for forming forms a polynomial of the form:

$$V_{mod2}=K_0+(K_1)(V_{tune2})+m(V_{sig})$$

where $V_{mod2}$ is the modulation control voltage, $V_{tune2}$ is the tuning control voltage, $V_{sig}$ is the content carrying signal and $K_0$, $K_1$ and m are constants.

10. The apparatus according to claim 7 wherein the means for forming comprises:
   a. a first amplifier having a constant gain coupled to receive the tuning control voltage for forming a first amplifier output;
   b. a first summing block coupled to receive the first amplifier output and a constant for forming a first summing block output;
   c. a second amplifier having a constant gain coupled to receive the content-carrying signal for forming a second amplifier output; and
   d. a second summing block coupled to receive the first summing block output and the second amplifier output for forming the modulation control signal.

11. The apparatus according to claim 7 wherein the oscillator means comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a resistor having a first terminal coupled to output terminals of the cross-coupled pair of transistors and a second terminal coupled to a ground node.

12. The apparatus according to claim 7 wherein the oscillator means comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a capacitor coupled across output terminals of the cross-coupled pair of transistors; and
   d. a pair of resistors each having a first terminal coupled to a respective one the output terminals of the cross-coupled pair of transistors and each having a second terminal coupled to a ground node.

13. An apparatus for linearizing a frequency deviation response for a voltage controlled oscillator, the apparatus comprising:
   a. a voltage-controlled oscillator having a tuning input to receive a tuning control signal to adjust a center frequency for the voltage-controlled oscillator and a modulation input to receive a modulation control signal to modulate an output signal formed by the voltage-controlled oscillator; and
   b. a correction circuit coupled to the voltage-controlled oscillator to receive the tuning control signal and a content-carrying signal to form the modulating control signal such that a frequency deviation caused by an incremental change in the modulating control signal is substantially constant despite changes in the tuning control voltage.

14. The apparatus according to claim 13 wherein the correction circuit forms a first order polynomial.

15. The apparatus according to claim 13 wherein the correction circuit forms a polynomial of the form:

$$V_{mod2}=K_0+(K_1)(V_{tune2})+m(V_{sig})$$

where $V_{mod2}$ is the modulation control voltage, $V_{tune2}$ is the tuning control voltage, $V_{sig}$ is the content carrying signal and $K_0$, $K_1$ and m are constants.

16. The apparatus according to claim 13 wherein the correction circuit comprises:
   a. a first amplifier having a constant gain coupled to receive the tuning control voltage for forming a first amplifier output;
   b. a first summing block coupled to receive the first amplifier output and a constant for forming a first summing block output;
   c. a second amplifier having a constant gain coupled to receive the content-carrying signal for forming a second amplifier output; and
   d. a second summing block coupled to receive the first summing block output and the second amplifier output for forming the modulation control signal.

17. The apparatus according to claim 13 wherein the voltage-controlled oscillator comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;

c. a resistor having a first terminal coupled to output terminals of the cross-coupled pair of transistors and a second terminal coupled to a ground node.

18. The apparatus according to claim 13 wherein the voltage-controlled oscillator comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a capacitor coupled across output terminals of the cross-coupled pair of transistors; and
   d. a pair of resistors each having a first terminal coupled to a respective one the output terminals of the cross-coupled pair of transistors and each having a second terminal coupled to a ground node.

19. A method of linearizing a frequency deviation response in a voltage controlled oscillator, the method comprising:
   a. providing an oscillator means having a tuning input for receiving a tuning control signal for adjusting a center frequency for the oscillator means and a modulation input for receiving a modulation control signal for modulating an output signal formed by the oscillator means; and
   b. forming the modulating control signal based upon the tuning control signal and a content-carrying signal.

20. The method according to claim 19 wherein the step of forming forms a first order polynomial.

21. The method according to claim 19 wherein the step of forming forms a polynomial of the form:

$$V_{mod2}=K_0+(K_1)(V_{tune2})+m(V_{sig})$$

where $V_{mod2}$ is the modulation control voltage, $V_{tune2}$ is the tuning control voltage, $V_{sig}$ is the content carrying signal and $K_0$, $K_1$ and m are constants.

22. The method according to claim 19 wherein the step of forming is performed by a correction circuit comprising:
   a. a first amplifier having a constant gain coupled to receive the tuning control voltage for forming a first amplifier output;
   b. a first summing block coupled to receive the first amplifier output and a constant for forming a first summing block output;
   c. a second amplifier having a constant gain coupled to receive the content-carrying signal for forming a second amplifier output; and
   d. a second summing block coupled to receive the first summing block output and the second amplifier output for forming the modulation control signal.

23. The method according to claim 19 wherein the oscillator means comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a resistor having a first terminal coupled to output terminals of the cross-coupled pair of transistors and a second terminal coupled to a ground node.

24. The method according to claim 19 wherein the voltage-controlled oscillator comprises:
   a. an L-C portion wherein capacitance for the L-C portion is variable in response to the tuning control signal and in response to the modulation control signal;
   b. a pair of cross-coupled pair of transistors, each having a control terminal coupled to the L-C portion;
   c. a capacitor coupled across output terminals of the cross-coupled pair of transistors; and
   d. a pair of resistors each having a first terminal coupled to a respective one the output terminals of the cross-coupled pair of transistors and each having a second terminal coupled to a ground node.

* * * * *